(12) United States Patent
Mancini et al.

(10) Patent No.: US 6,562,553 B2
(45) Date of Patent: May 13, 2003

(54) LITHOGRAPHIC PRINTING METHOD USING A LOW SURFACE ENERGY LAYER

(75) Inventors: David P. Mancini, Fountain Hills, AZ (US); Douglas J. Resnick, Phoenix, AZ (US)

(73) Assignee: Motorola, Inc., Schaumburg, IL (US)

( * ) Notice: Subject to any disclaimer, the term of this patent is extended or adjusted under 35 U.S.C. 154(b) by 33 days.

(21) Appl. No.: 09/881,242

(22) Filed: May 10, 2001

(65) Prior Publication Data

US 2001/0031426 A1 Oct. 18, 2001

Related U.S. Application Data

(62) Division of application No. 09/198,627, filed on Nov. 24, 1998, now Pat. No. 6,300,042.

(51) Int. Cl.[7] .................................................. G03F 7/00
(52) U.S. Cl. ...................... 430/325; 430/311; 430/313; 430/315; 430/324; 427/271
(58) Field of Search ................... 430/311, 313, 430/315, 324, 325; 427/271

(56) References Cited

U.S. PATENT DOCUMENTS

| | | | |
|---|---|---|---|
| 4,022,928 A | 5/1977 | Piwcyzk ........................ 427/43 |
| 4,131,363 A | 12/1978 | Shea et al. .................... 355/75 |
| 4,199,649 A | * 4/1980 | Yundt .......................... 428/411 |
| 4,282,314 A | 8/1981 | Dinella et al. ............... 430/413 |
| 4,482,511 A | * 11/1984 | Komatsubara ............... 264/22 |
| 4,514,489 A | 4/1985 | Garcia et al. ................ 430/327 |
| 4,528,261 A | 7/1985 | Hauser ........................ 430/322 |
| 5,006,382 A | * 4/1991 | Squire ........................ 428/35.7 |
| 5,061,024 A | 10/1991 | Keys ........................... 359/350 |
| 5,188,863 A | * 2/1993 | de Graaf et al. ............ 427/512 |
| 5,198,267 A | * 3/1993 | Aharoni et al. ............. 427/162 |
| 5,356,739 A | 10/1994 | Kawasaki et al. ............. 430/5 |
| 5,759,625 A | 6/1998 | Laubacher et al. ......... 427/264 |
| 6,347,016 B1 | * 2/2002 | Ishida et al. .................. 360/17 |

FOREIGN PATENT DOCUMENTS

| | | | |
|---|---|---|---|
| FR | 2280924 | 2/1976 | |
| GB | 2249196 | 4/1992 | |
| JP | 52-117102 | * 10/1977 | |
| JP | 55033813 | 3/1980 | ............. G03F/1/00 |
| JP | 5550627 | 4/1980 | ......... H01L/21/302 |
| JP | 55122737 | 9/1980 | ............. G03F/1/00 |
| JP | 5632143 | 4/1981 | ............. G03F/1/00 |
| JP | 5681844 | 7/1981 | ............. G03F/1/00 |
| JP | 6145471 | 9/1981 | ........... B29D/17/00 |
| JP | 56130748 | 1/1982 | |
| JP | 5746243 | 3/1982 | ............. G03F/1/00 |
| JP | 5756929 | 5/1982 | ........... H02L/21/30 |
| JP | 57046243 | 7/1982 | |
| JP | 6240458 | 2/1987 | ............. G03F/1/00 |
| JP | 3164924 | 7/1988 | ........... C23C/16/30 |
| JP | 1-107338 | * 4/1989 | |
| JP | 2-15169 | * 1/1990 | |
| JP | 02015169 | 3/1990 | |

* cited by examiner

Primary Examiner—Mark F. Huff
Assistant Examiner—Nicole Barreca
(74) Attorney, Agent, or Firm—William E. Koch

(57) ABSTRACT

A method of contact printing on a device using a partially transparent mask (18) having first and second surfaces, comprises the steps of applying a layer of low surface energy polymeric material (22) to the first surface of the mask; placing the first surface (24) of the mask contiguous to the device (10), the layer of low surface energy polymeric material being substantially in contact with the device; and applying radiation (32) to the second surface of the mask for affecting a pattern in the device.

12 Claims, 3 Drawing Sheets

LITHOGRAPHIC PRINTING METHOD USING A LOW SURFACE ENERGY LAYER

The present application is a division of U.S. application Ser. No. 09/198,627, filed on Nov. 24, 1998, now U.S. Pat. No. 6,300,042, which is hereby incorporated by reference, and priority thereto for common subject matter is hereby claimed. The present invention relates in general to stamping and, more particularly, to a method of coating a stamp in an imprinting process.

BACKGROUND OF THE INVENTION

The fabrication of integrated circuits involves the creation of several layers of materials that interact in some fashion. One or more of these layers may be patterned so various regions of the layer have different electrical characteristics, which may be interconnected within the layer or to other layers to create electrical components and circuits. These regions may be created by selectively introducing or removing various materials. The patterns that define such regions may be created by lithographic processes. For example, a layer of photoresist material is applied onto a layer overlying a wafer substrate. A mask (containing clear and opaque areas) is used to selectively expose this photoresist material by a form of radiation, such as ultraviolet light, electrons, or x-rays. Either the photoresist material exposed to the light, or that not exposed to the light, is removed by the application of a solvent. An etch may then be applied to the layer not protected by the remaining resist, and when the resist is removed, the layer overlying the substrate is patterned.

In this photolithographic process, the mask may be placed in contact with the photoresist (contact printing), may be placed close to the photoresist (proximity printing), or may be projected over a larger distance (projection printing). The contact printing method was probably the earliest method used to produce patterns on integrated circuits and may provide excellent resolution and high throughput. The mask must be correctly aligned on the photoresist/layer, e.g., when previous patterns have been created. The mask is secured to the photoresist covered layer by clamping or vacuum, for example.

However, for contact printing, defects in the pattern or the mask are routinely experienced, especially when the mask is used repeatedly to print several substrates consecutively without cleaning the mask. These defects print on the next layer that is exposed to the mask. Consequently, hard surface masks used in contact printing must be inspected and cleaned regularly, a time consuming and expensive process. And if the defects cannot be eliminated, the masks must be replaced.

These defects in contact printing occur when particles of the photoresist, being tacky or sticky in nature, stick to the mask. Conventional masks comprise a chrome and glass surface, with the radiation passing through the glass but not the chrome. Glass and chrome both have a high surface energy and readily induce particles of photoresist and dirt to cling thereto. When particles stick to the glass, the radiation is absorbed (blocked) and does not reach the photoresist on subsequent layers being processed. Failure of the radiation to reach these small areas on subsequent layers of photoresist creates defects. Furthermore, particles sticking to either the glass or the chrome prevent close contact (creating a gap) between the mask and the photoresist surface, reducing resolution of the resulting image. As resolution is reduced, the lines of demarcation between areas become less defined. Therefore, it is desired to have minimal diffraction induced resolution loss.

Efforts in the past to resolve these problems include applying a thin, one molecule deep, conversion coating (fluorinated hydrocarbon chlorosilane monomers) to the mask. This coating would bond to the glass portion of the mask, but has less affinity to bond with the chrome portion of the mask. Test results using a small number of samples showed that this coating had very limited durability. As a result of this lack of durability, the coating would have to be reapplied after only a few uses.

Therefore, an improved method of contact printing is desired that greatly reduces defects by reducing the number of particles attaching to the mask during the photolithography process.

DETAILED DESCRIPTION OF THE PREFERRED EMBODIMENT

Figure 1:
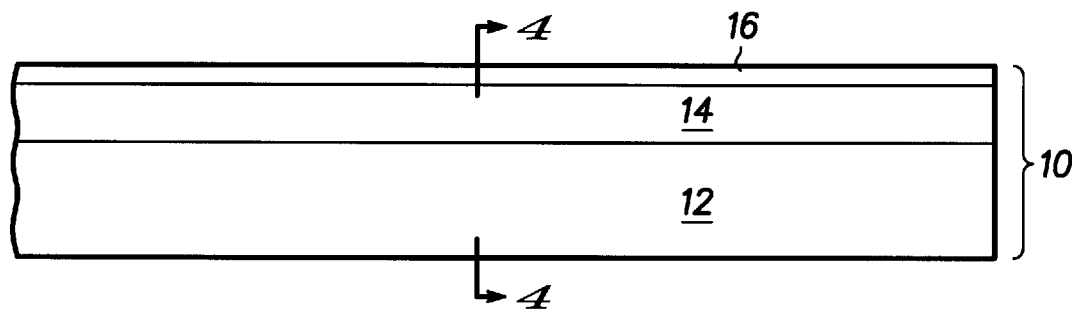
FIG. 1 illustrates a front view of layers of an integrated circuit prior to processing with a photolithographic mask.

Referring to FIG. 1, an integrated circuit 10 under manufacture is shown including a substrate 12 underneath a layer 14. The substrate 12 and layer 14 may comprise any material used in making integrated circuits, e.g., silicon or gallium arsenide as currently known. By conventional methods, a layer 16 of photoresist is applied to layer 14.

Figure 2:
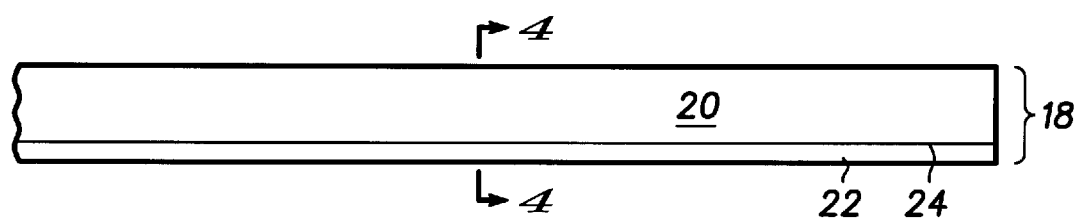
FIG. 2 illustrates a front view of a mask.

Referring to FIG. 2, a simple figure of a mask 18 is shown comprising a base 20 typically manufactured of glass or quartz, with sections of opaque material, typically chrome, interspersed throughout in a manner well known to those skilled in the art. A layer 22 of low surface energy polymeric material containing solvents is applied to the surface 24 of the base 20. The material, in one embodiment, comprises a tetrafluoroethylene containing resin, or a copoylmer of tetrafluoroethylene and bistrifluoromethyl difluoro dioxole. These materials are temperature resistant, durable, transparent, and have substantially a zero moisture absorption and a low coefficient of friction. More importantly, they are resistant to adhesion which prevents the material from collecting particles of resist and dirt when making contact with the resist. In other embodiments, the material may comprise a amorphous fluoropolymer, hydrocarbon or a silicone based material, for example. The material may be applied in any one of several conventional ways, such as spin coating, spraying, dipping, or vapor deposition. The material may be applied with a thickness, for example, of 40 Å to 50 microns, but 700 Å has been shown to work very well.

Figure 3:
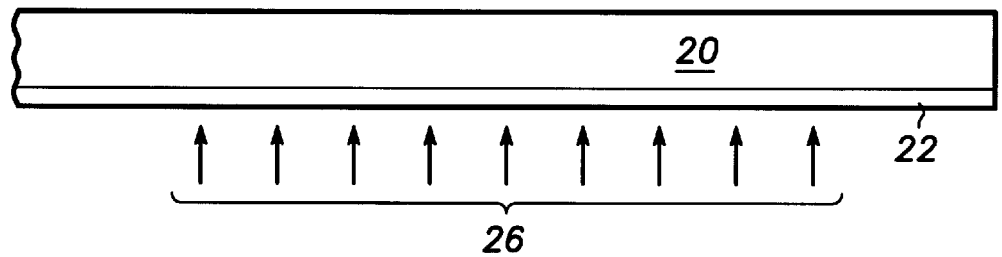
FIG. 3 illustrates a front view of a mask being subjected to heat.

In FIG. 3, heat 26 (represented by the arrows) is applied to the layer 22 of low surface energy polymeric material to remove the solvents. Even though the material is thermally stable with a high $T_g$, heating (baking) the material above $T_g$ (approximately 160° C. to 300° C.) for a short duration, e.g. baking for 3 minutes at 180° C., will remove solvents within the material.

Figure 4:
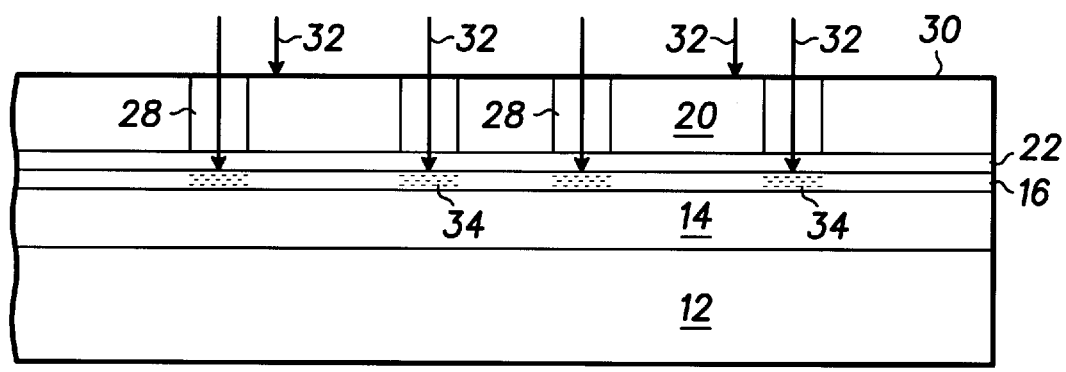
FIG. 4 illustrates a cut away view taken along the line 4—4 of FIG. 1 during processing with the mask in contact with the integrated circuit.

Referring to FIG. 4, a cutaway view is shown of the mask 18 in contact with the integrated circuit 10. As mentioned above, transparent material 28 is interspersed within the base 20. Radiation 32 (represented by the arrows) is applied to the surface 30 of the base 20, being absorbed and reflected by the base 20, but passing through transparent material 28 and low surface energy polymeric material of layer 22 to strike the resist of layer 16 creating a pattern.

Then the mask 18 is removed without substantially any of the resist of layer 16 sticking to the material on layer 22. Dry adhesion between the mask 18 and layer 16 and between layer 16 to the underlying layer 14, may be expressed by the dispersion interaction as follows:

$$W_{a(MR)} = 2(\gamma M^d \gamma R^d)$$

$$W_{a(RS)} = 2(\gamma R^d \gamma S^d)$$

where the suffixes M, R, and S denote the mask 18, layer 16, and layer 14, respectively. $W_a$ is the work of adhesion indicating the affinity between two materials denoted by suffixes, and $\gamma_d$ is the dispersion component of surface free energy. Since adhesion increases with $W_a$, the photoresist will stick to the photomask rather than the substrate when $$W_{a(MR)} > W_{a(RS)}$$

Substituting the first and second formulas into the third produces $$\gamma M^d > \gamma S^d$$

Consequently, to prevent the photoresist sticking to the mask, $\gamma M^d$ must be smaller than $\gamma S^d$. Lowering the surface energy of the mask by coating its surface with the appropriate low surface energy material accomplishes this goal. By the resist of layer 16 not sticking to the material 22, at least two advantages over the prior art are gained. First, the mask 18 (material 22) can be placed in direct contact (no gap) with the photoresist of layer 16 on subsequent masking operations thereby providing better resolution. Second, the radiation 32, 36 passing through the glass 28 will not be "blocked" from reaching the subsequent resist by particles of resist from the previous operation, thereby preventing defects. One test of a low surface energy material demonstrated no change in exposure energy, no introduction of defects and no loss of resolution after 100 wafer exposures.

Figure 5:
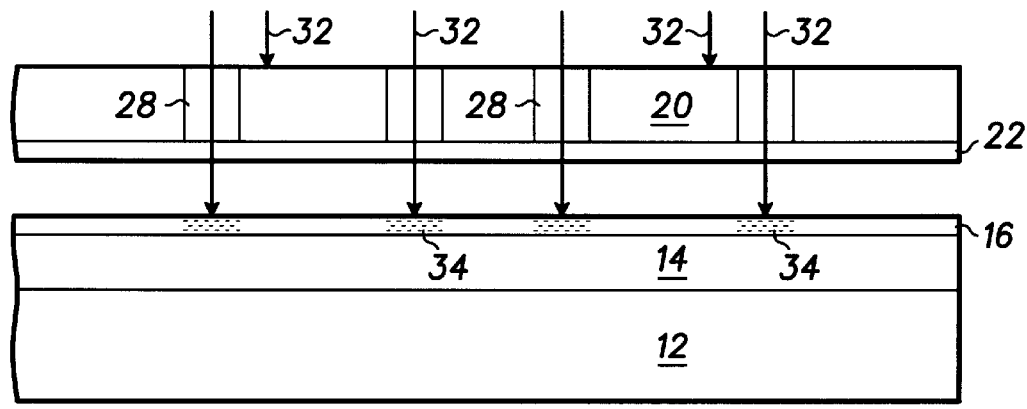
FIG. 5 illustrates a cut away view taken along the line 4—4 of FIG. 1 during processing with the mask separated from the integrated circuit.

FIG. 5 illustrates another embodiment wherein the mask 18 is separated from the layer 16 of resist prior to the radiation 32, 36 being applied. This method is typically referred to as proximity printing. The mask 18 is placed in contact with layer 16 for proper allignment.

Figure 6:
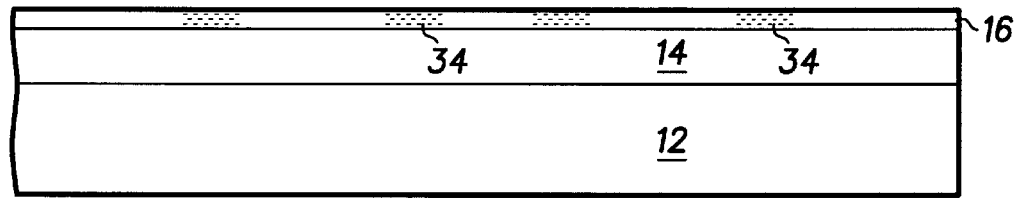
FIGS. 6–11 illustrate semiconductor processing of the integrated circuit of FIG. 1 after processing with the mask.
Figure 7:
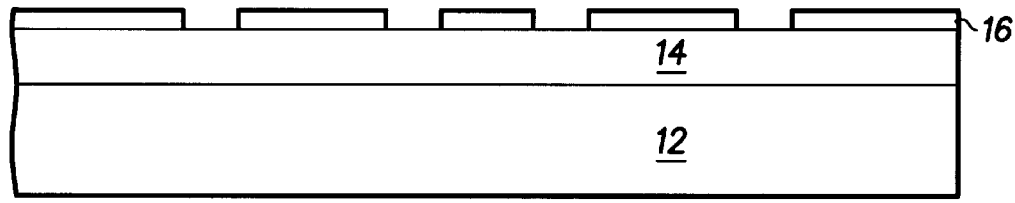

FIGS. 6 and 7 illustrate typical processes after the mask 18 is removed. The portions 34 of the photoresist of layer 16 irradiated (exposed) are made soluble in a solvent (developer), the soluble portion of the photoresist of layer 16 being removed. It should be understood that, in another embodiment, the radiation may make the photoresist of layer 16 insoluble, depending on the solvent selected, with the non-radiated portion being removed (not shown here).

Figure 8:
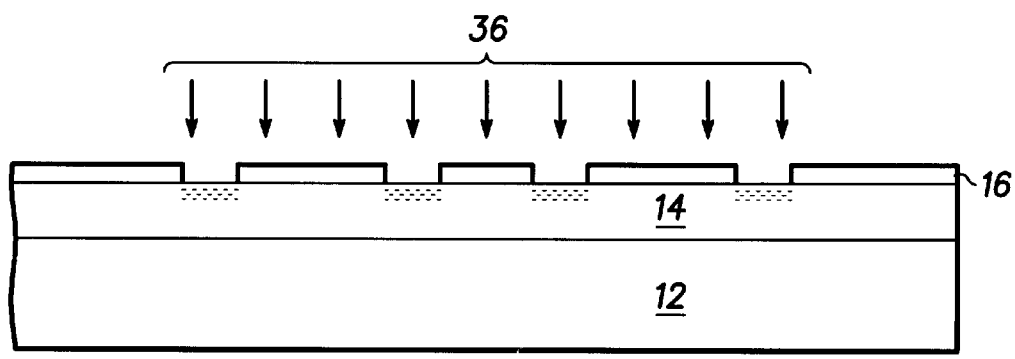
Figure 9:
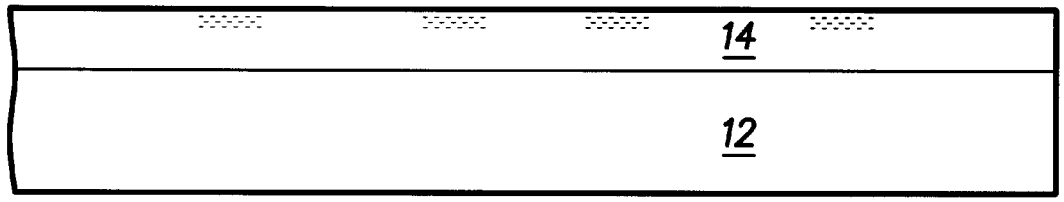
Figure 10:
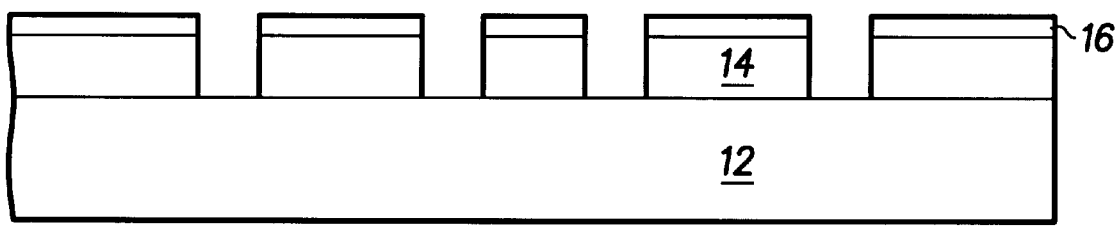
Figure 11:
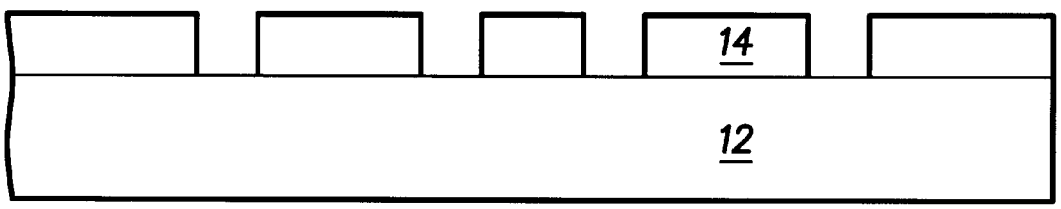

Then, using conventional methods, the integrated circuit 10 is further processed. For example, FIGS. 8 and 9 show radiation 36 such as ions being implanted into layer 14 prior to the layer 16 being removed. Alternatively, for example, FIGS. 10 and 11 show layer 14 being etched prior to the removal of the layer 16. This invention may be applied to contact printing or stamping lithography in many other technologies besides the semiconductor industry, e.g., the making of compact discs (CDs) or other such device. CDs are manufactured with a lithographic process by replicating data as a series of bumps on a plastic disc that can be read with the use of a laser beam. In a manner well known to those in the CD industry, a nickel pattern is formed by electroplating nickel onto a photoresist patterned glass master. A stamper is then formed by separating the nickel from the glass and removing the photoresist. The pattern information on the stamp is transferred into a soft and malleable injection molded polycarbonate via a stamping process. This process typically contaminates the stamp when excess polycarbonates and light dirt or soil adhere to the nickel master, causing similar problems as discussed above for the semiconductor example. A low surface energy release agent coating can be applied to the nickel master to prevent contamination.

Yet another embodiment comprises placing the mask 18 a predetermined distance from the device (as represented in FIG. 5) on which a pattern is to be created by projecting radiation typically through a lens. This method is typically referred to as projection printing. The layer 22 of low surface energy polymeric material prevents dirt from the environment from sticking to the mask 18.

In summary, a photolithography mask with a coating material of low surface energy polymeric material is provided that has a low surface energy, and is (1) easily applied, (2) easily removed (e.g., with a fluorinated solvent), (3) is transparent to exposure radiation, (4) is thin and uniformly applied to avoid resolution losses, and (5) is cohesively strong for durability.

What is claimed is:

1. A method of creating patterns in a device with a stamp having a pattern, comprising the steps of:
   (a) applying a layer of low surface energy amorphous fluoropolymer material to a surface of at least one of the stamp and the device;
   (b) placing the stamp substantially in contact with the device, the layer being between the stamp and the device;
   (c) applying pressure to the stamp so the pattern is created in the device; and
   (d) removing the stamp from the device.

2. The method of claim 1, subsequent to step (a), further comprising the step of (e) heating the low surface energy amorphous fluoropolymer.

3. The method of claim 1 wherein step (a) comprises the step of applying amorphous tetrafluoroethylene containing resin to the surface of at least one of the stamp and the device.

4. The method of claim 1 wherein step (a) comprises the step of applying amorphous fluoropolymer with a thickness within the range of 40 Å to 50 microns.

5. The method of claim 1 wherein step (a) comprises the step of applying amorphous fluoropolymer with a thickness of 700 Å.

6. The method of claim 1 wherein step (a) comprises the step of applying a copolymer of tetrafluoroethylene and bistrifluoromethyl difluoro dioxole to the surface of at least one of the stamp and the device.

7. A method of manufacturing an integrated circuit device, comprising the steps of:
   (a) forming a semiconductor layer having a surface;
   (b) applying a low surface energy amorphous fluoropolymer material to a surface of at least one of a stamp and the surface of the semiconductor layer;
   (c) placing the stamp substantially in contact with the semiconductor layer, the layer being between the stamp and the semiconductor layer;
   (d) applying pressure to the stamp so that pattern is created in the semiconductor layer; and
   (e) removing the stamp from the semiconductor layer.

8. The method of claim 7, subsequent to step (b), further comprising the step of (f) heating the low surface energy amorphous fluoropolymer material.

9. The method of claim 7 wherein step (b) comprises the step of applying amorphous tetrafluoroethylene containing resin to the surface of the at least one of the stamp and the device.

10. The method of claim 7 wherein step (b) comprises the step of applying amorphous fluoropolymer with a thickness of 700 Å to surface of the at least one of the stamp and the device.

11. The method of claim 7 wherein step (b) comprises the step of applying amorphous fluoropolymer with a thickness within the range of 40 Å to 50 microns.

12. The method of claim 7 wherein step (b) comprises the step of applying a copolymer of tetrafluoroethylene and bistrifluoromethyl difluoro dioxole to the surface of the at least one of the stamp and the device.

* * * * *